(12) United States Patent
Akutsu

(10) Patent No.: US 9,585,247 B2
(45) Date of Patent: Feb. 28, 2017

(54) ANISOTROPIC CONDUCTIVE FILM AND METHOD OF PRODUCING THE SAME

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 66 days.

(21) Appl. No.: 14/418,743

(22) PCT Filed: Aug. 2, 2013

(86) PCT No.: PCT/JP2013/071033
§ 371 (c)(1),
(2) Date: Jan. 30, 2015

(87) PCT Pub. No.: WO2014/021457
PCT Pub. Date: Feb. 6, 2014

(65) Prior Publication Data
US 2015/0271918 A1    Sep. 24, 2015

(30) Foreign Application Priority Data
Aug. 3, 2012  (JP) ................................ 2012-173448

(51) Int. Cl.
*C09J 133/04*     (2006.01)
*H05K 1/03*     (2006.01)
(Continued)

(52) U.S. Cl.
CPC ............... *H05K 1/036* (2013.01); *C09D 4/00* (2013.01); *C09D 133/04* (2013.01);
(Continued)

(58) Field of Classification Search
CPC ........ H05K 1/036; C09D 4/00; C09D 133/04; C09J 163/00
See application file for complete search history.

(56) References Cited

U.S. PATENT DOCUMENTS

| 6,020,059 A | 2/2000 | Yamada et al. |
| 2007/0207298 A1* | 9/2007 | Suzuki ................... G02B 1/118 |
| | | 428/216 |

FOREIGN PATENT DOCUMENTS

| CN | 101601171 A | 12/2009 |
| JP | 3107888 A | 5/1991 |
| | (Continued) | |

OTHER PUBLICATIONS

Dec. 8, 2015 Office Action issued in Taiwanese Patent Application No. 102127913.
(Continued)

*Primary Examiner* — Jenny L Wagner
*Assistant Examiner* — Michael E Moats, Jr.
(74) *Attorney, Agent, or Firm* — Oliff PLC

(57) ABSTRACT

An anisotropic conductive film includes a first connection layer and a second connection layer formed on one side of the first connection layer. The first connection layer is obtained by photo-radical polymerization of a photo-radical polymerizable resin layer containing an acrylate compound and a photo-radical polymerization initiator. The second connection layer includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Conductive particles for anisotropic conductive connection are
(Continued)

arranged in a single layer on a second connection layer-side surface of the first connection layer.

15 Claims, 7 Drawing Sheets

(51) Int. Cl.
| | |
|---|---|
| C09J 163/00 | (2006.01) |
| H01R 4/04 | (2006.01) |
| H01B 1/22 | (2006.01) |
| H01L 23/00 | (2006.01) |
| C09D 4/00 | (2006.01) |
| C09D 133/04 | (2006.01) |
| H05K 1/11 | (2006.01) |
| H05K 3/12 | (2006.01) |

(52) U.S. Cl.
CPC .............. *C09J 163/00* (2013.01); *H01B 1/22* (2013.01); *H01L 24/29* (2013.01); *H01R 4/04* (2013.01); *H05K 1/11* (2013.01); *H05K 3/1283* (2013.01); *H01L 2224/2929* (2013.01); *H01L 2224/83101* (2013.01); *H01L 2224/83194* (2013.01); *H01L 2924/01322* (2013.01); *H01L 2924/15788* (2013.01); *H01L 2924/181* (2013.01); *Y10T 428/31511* (2015.04); *Y10T 428/31928* (2015.04)

(56) References Cited

FOREIGN PATENT DOCUMENTS

| | | | |
|---|---|---|---|
| JP | 4366630 | A | 12/1992 |
| JP | 9312176 | A | 12/1997 |
| JP | 2000178511 | A | 6/2000 |
| JP | 2003286457 | A | 10/2003 |
| JP | 2008034232 | A | 2/2008 |
| JP | 2009-016133 | A | 1/2009 |

OTHER PUBLICATIONS

Feb. 12, 2015 International Preliminary Report on Patentability issued in International Applcation No. PCT/JP2013/071033.
Nov. 12, 2013 International Search Report issued in International Application No. PCT/JP2013/071033.
Sep. 7, 2016 Office Action issued in Korean Patent Application No. 2015-7001036.

* cited by examiner

ANISOTROPIC CONDUCTIVE FILM AND METHOD OF PRODUCING THE SAME

TECHNICAL FIELD

The present invention relates to an anisotropic conductive film and a method of producing the same.

BACKGROUND ART

Anisotropic conductive films are widely used in mounting electronic parts such as IC chips. In recent years, from the viewpoint of application to a high mounting density, there is proposed a two-layer structured anisotropic conductive film in which conductive particles for anisotropic conductive connection are arranged in a single layer on an insulating adhesive layer, for the purpose of improvement in connection reliability and insulating properties, improvement in particle capturing efficiency, reduction in production cost, and the like (Patent Literature 1).

This two-layer structured anisotropic conductive film is produced by arranging conductive part idles on a transfer layer in a single layer and in a closely packed manner, followed by performing biaxial stretching treatment of the transfer layer, to form the transfer layer on which the conductive particles are uniformly arranged at prescribed intervals, then transferring the conductive particles on the transfer layer to an insulating resin layer containing a thermosetting resin and a polymerization initiator, and further laminating another insulating resin layer that contains a thermosetting resin but does not contain a polymerization initiator, on the transferred conductive particles (Patent Literature 1).

CITATION LIST

Patent Literature

Patent Literature 1: Specification of Japanese patent No. 4789738

SUMMARY OF INVENTION

Technical Problem

However, the two-layer structured anisotropic conductive film disclosed in Patent Literature 1 includes an insulating resin layer that does not contain a polymerization initiator. For this reason, despite the fact that the conductive particles are uniformly arranged in a single layer at prescribed intervals, the heating during anisotropic conductive connection is likely to cause a relatively large resin flow to occur in the insulating resin layer that does not contain a polymerization initiator. Thus, the conductive particles are also likely to flow along the flow. Accordingly, there arose problems such as reduction in particle capturing efficiency, occurrence of a short circuit, and reduction in insulating properties.

An object of the present invention is to solve the above-described problems in association with the conventional technique, and to realize favorable connection reliability, favorable insulating properties, and favorable particle capturing efficiency, in a multilayer-structured anisotropic conductive film having conductive particles arranged in a single layer.

Solution to Problem

The present inventor has found that the above object of the present invention can be achieved by an anisotropic conductive film obtained by arranging conductive particles on a photo-radical polymerizable resin layer and thereafter irradiating it with UV light to thereby fix or temporarily fix the conductive particles, and further laminating a thermal- or photo-, cationic, anionic or radical polymerizable resin layer on the fixed or temporarily fixed conductive particles. Thus, the present invention has been completed.

That is, the present invention provides an anisotropic conductive film including a first connection layer, and a second connection layer formed on one surface of the first connecting layer, wherein the first connection layer is obtained by photo-radical polymerization of a photo-radical polymerizable resin layer containing an acrylate compound and a photo-radical polymerization initiator, the second connection layer includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator, and conductive particles for anisotropic conductive connection are arranged in a single layer on a second connection layer-side surface of the first connection layer.

It is noted that although the second connection layer is preferably a thermal polymerizable resin layer using a thermal polymerization initiator that initiates polymerization reaction by heating, it may be a photo-polymerizable resin layer including a photo-polymerization initiator that initiates polymerization reaction by light. The second connection layer may also be a thermal- and photo-polymerizable resin layer including a thermal polymerization initiator and a photo-polymerization initiator used in combination. Here, the second connection layer may be limited to a thermal polymerizable resin layer using a thermal polymerization initiator in terms of producing in some cases.

The anisotropic conductive film according to the present invention may include a third connection layer having a structure substantially similar to that of the second connection layer, on the other surface of the first connection layer, for the purpose of preventing warpage of a connection body, such as stress relaxation. That is, on the other surface of the first connection layer, there may be provided the third connection layer that includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator.

It is noted that although the third connection layer is preferably a thermal polymerizable resin layer including a thermal polymerization initiator that initiates polymerization reaction by heating, it may be a photo-polymerizable resin layer using a photo-polymerization initiator that initiates polymerization reaction by light. The third connection layer may also be a thermal- and photo-polymerizable resin layer including a thermal polymerization initiator and a photo-polymerization initiator used in combination. Here, the third connection layer may be limited to a thermal polymerizable resin layer including a thermal polymerization initiator in terms of producing in some cases.

Furthermore, the present invention provides a method of producing the above-described anisotropic conductive film, including: steps (A) to (C) below in which the first connection layer is formed by a photo-radical polymerization reaction in a single stage, or steps (AA) to (DD) described later in which the first connection layer is formed by a photo-radical polymerization reaction in two stages.

(When Forming First Connection Layer by One-Phase Photo-Radical Polymerization Reaction)

Step (A)

A step of arranging conductive particles in a single layer, on a photo-radical polymerizable resin layer containing an acrylate compound and a photo-radical polymerization initiator;

Step (B)

a step of irradiating the photo-radical polymerizable resin layer on which the conductive particles are arranged, with UV light, to initiate photo-radical polymerization reaction, so as to form a first connection layer having a surface on which the conductive particles are fixed; and Step (C)

a step of forming, on the conductive particles-side surface of the first connection layer, a second connection layer including a thermal- or photo-, cationic or anionic polymerizable resin layer containing an epoxy compound and a thermal- or photo-, cationic or anionic polymerization initiator or a thermal- or photo-radical polymerizable resin layer containing an acrylate compound and a thermal- or photo-radical polymerization initiator.

(When Forming First Connection Layer by Two-Phase Photo-Radical Polymerization Reaction)

Step (AA)

A step of arranging conductive particles in a single layer, on a photo-radical polymerizable resin layer containing an acrylate compound and a photo-radical polymerization initiator;

Step (BB)

a step of irradiating the photo-radical polymerizable resin layer on which the conductive particles are arranged, with UV light, to initiate photo-radical polymerization reaction, so as to form a temporal first connection layer having a surface on which the conductive particles are temporarily fixed;

Step (CC)

a step of forming, on the conductive particles-side surface of the temporal first connection layer, a second connection layer including a thermal cationic or thermal anionic polymerizable resin layer containing an epoxy compound and a thermal cationic or thermal anionic polymerization initiator, or a thermal radical polymerizable resin layer containing an acrylate compound and a thermal radical polymerization initiator; and Step (DD)

a step of irradiating the temporal first connection layer with UV light from an opposite side to the second connection layer to initiate photo-radical polymerization reaction, so as to permanently cure the temporal first connection layer to form the first connection layer.

The initiator used when forming the second connection layer in the step (CC) is limited to the thermal polymerization initiator. This is because adverse effects are prevented from being exerted on the product life as an anisotropic conductive film and the stability of connection and a connection structure. In brief, when the first connection layer is irradiated in two stages, the second connection layer may need to be limited to the thermal polymerization initiator in some cases due to the restriction of the steps. It is noted that when the irradiation in two stages is continuously performed, the formation can be performed in a step substantially similar to that performed in a single stage. Therefore, equivalent operations and effects to those obtained in the case performed in a single stage can be expected.

Furthermore, the present invention provides a method of producing an anisotropic conductive film including, on the other surface of the first connection layer, a third connection layer having a similar structure to that of the second connection layer, the production method including the following step (Z) after the step (C) in addition to the steps (A) to (C) described above, or the following step (Z) after the step (DD) in addition to the steps (AA) to (DD) described above.

Step (Z)

A step of forming, on an opposite surface to the conductive particles-side of the first connection layer, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator.

Furthermore, the present invention provides a method of producing an anisotropic conductive film including, on the other side of the first connection layer, a third connection layer having a similar structure to that of the second connection layer, the production method including the following step (a) prior to the step (A) in addition to the steps (A) to (C) described above, or the following step (a) prior to the step (AA) in addition to the steps (AA) to (DD) described above.

Step (a)

A step of forming, on one surface of the photo-radical polymerizable resin layer containing the acrylate compound and the photo-radical polymerization initiator, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator.

It is noted that in the step (A) or the step (AA) of the production method including the step (a), the conductive particles may be arranged in a single layer on the other surface of the photo-radical polymerizable resin layer.

When the third connection layer is disposed in such a step, the polymerization initiator is preferably limited to a thermal reactive substance from the above-described reason. However, if the second and third connection layers containing a photo-polymerization initiator are disposed after the first connection layer is disposed in a method that does not exert adverse effects on the product life and the connection, the preparation of the anisotropic conductive film containing a photo-polymerization initiator that follows the gist of the present invention is not particularly limited.

It is noted that an aspect in which one of the second connection layer and the third connection layer according to the present invention functions as a tack layer is also encompassed by the present invention.

In addition, the present invention provides a connection structure in which a first electronic component is connected to a second electronic component by anisotropic conductive connection using the above-described anisotropic conductive film.

Advantageous Effects of Invention

The anisotropic conductive film according to the present invention includes: a first connection layer obtained by photo-radical polymerization of a photo-radical polymerizable resin layer containing an acrylate compound and a photo-radical polymerization initiator; and a second connection layer that is formed on one surface of the first connection layer and includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Furthermore, conductive particles for anisotropic conductive connection are arranged in a single layer on a second connection layer-side surface of the first connection layer. For this reason, the conductive particles can be firmly fixed to the first connection layer. Furthermore, the photo-radical polymerizable resin layer below (in the back side of) the conductive particles in the first connection layer is not sufficiently irradiated with UV light due to the existence of the conductive particles. Therefore, the degree of cure rate relatively decreases, and favorable pressing properties are exerted. As a result, favorable conduction reliability, insulating properties, and particle capturing efficiency can be achieved.

When this connection is caused by heat, a method similar to the usual connection method of an anisotropic conductive film is used. When caused by light, pressing with a connection tool may be performed before the reaction is completed. In this case, the connection tool or the like is also heated in order to facilitate the resin flow and the pressing of particles in many cases. Also, when heat and light are used in combination, the above-described methods may be similarly performed.

In the case of anisotropic conductive connection using photo-reaction, the site is irradiated with light from the side of a light transmissive part. It is concerned that the irradiated light is inhibited by wiring. However, since the present invention exerts its effects on the anisotropic conductive connection for those having narrowed wiring (that is, wiring with narrowed pitches), no contradictions are particularly caused even if an aspect containing a photo-reactive compound that can endure connection is included.

DESCRIPTION OF EMBODIMENTS

<<Anisotropic Conductive Film>>

Hereinafter, an example of the anisotropic conductive film according to the present invention will be described in detail.

Figure 1:
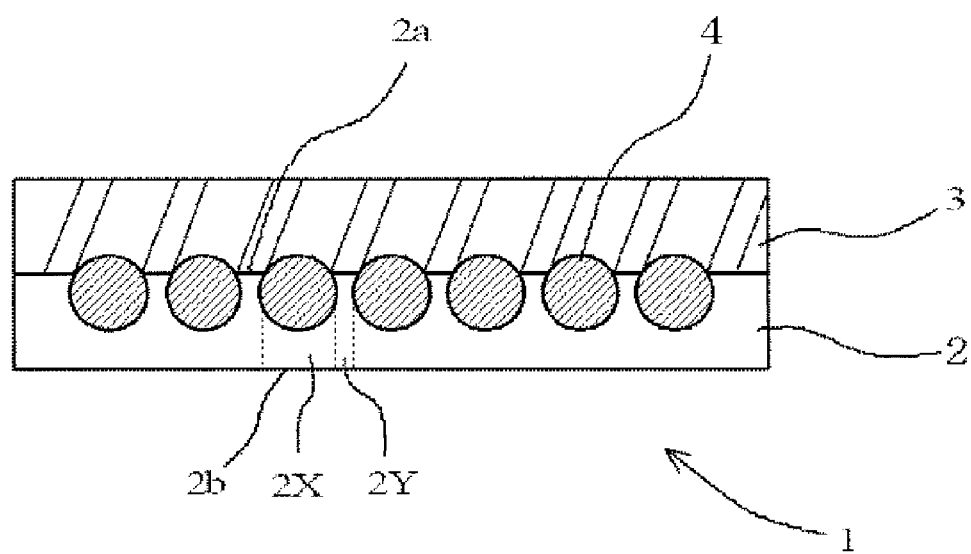
FIG. 1 is a cross-sectional view of an anisotropic conductive film according to the present invention.

As illustrated in FIG. 1, an anisotropic conductive film 1 according to the present invention has a structure in which a second connection layer 3 including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator is formed on one surface of a first connection layer 2 obtained by photo-radical polymerization of a photo-radical polymerizable resin layer containing an acrylate compound and a photo-radical polymerization initiator. Furthermore, conductive particles 4 are arranged, more preferably uniformly arranged, in a single layer for anisotropic conductive connection, on a surface 2a of the first connection layer 2 on the side of the second connection layer 3. As described herein, the term "uniformity" refers to a state in which conductive particles are arranged in a plane direction. The regularity may be provided at certain intervals.

<First Connection Layer 2>

Since the first connection layer 2 constituting the anisotropic conductive film 1 according to the present invention is obtained by photo-radical polymerization of the photo-radical polymerizable resin layer containing an acrylate compound and a photo-radical polymerization initiator, the conductive particles can be fixed. Also, since the first connection layer 2 is obtained by polymerization, the resin is unlikely to flow even when it is heated during anisotropic conductive connection. Therefore, occurrence of a short circuit can be significantly suppressed. Accordingly, connection reliability and insulating properties can be improved, while particle capturing efficiency can also be improved.

(Acrylate Compound)

As the acrylate compound that serves as an acrylate unit, a conventionally known photo-radical polymerizable acrylate can be used. For example, monofunctional (meth)acrylate (here, (meth)acrylate includes acrylate and methacrylate), and multifunctional (meth)acrylate having two or more functional groups can be used. In the present invention, in order to obtain a thermosetting adhesive, multifunctional (meth)acrylate is preferably used in at least a portion of acrylic-based monomers.

Examples of the monofunctional (meth)acrylate may include methyl(meth)acrylate, ethyl(meth)acrylate, n-propyl(meth)acrylate, i-propyl(meth)acrylate, n-butyl(meth)acrylate, i-butyl(meth)acrylate, t-butyl(meth)acrylate, 2-methylbutyl(meth)acrylate, n-pentyl(meth)acrylate, n-hexyl(meth)acrylate, n-heptyl(meth)acrylate, 2-methylhexyl(meth)acrylate, 2-ethylhexyl(meth)acrylate, 2-butylhexyl(meth)acrylate, isooctyl(meth)acrylate, isopentyl(meth)acrylate, isononyl(meth)acrylate, isodecyl(meth)acrylate, isobornyl (meth)acrylate, cyclohexyl(meth)acrylate, benzyl(meth)acrylate, phenoxy(meth)acrylate, n-nonyl(meth)acrylate, n-decyl(meth)acrylate, lauryl(meth)acrylate, hexadecyl (meth)acrylate, stearyl(meth)acrylate, and morpholine-4-yl (meth)acrylate. Examples of bifunctional (meth)acrylate may include bisphenol F-EO modified di(meth)acrylate, bisphenol A-EO modified di(meth)acrylate, polypropylene glycol di(meth)acrylate, polyethylene glycol(meth)acrylate, tricyclodecane dimethylol di(meth)acrylate, and dicyclopentadiene(meth)acrylate. Examples of the trifunctional (meth) acrylate may include trimethylol propane tri(meth)acrylate, trimethylol propane PO modified (meth)acrylate, and isocyanuric acid ED modified tri(meth)acrylate. Examples of the tetrafunctional or more (meth)acrylate may include dipentaerythritol penta(meth)acrylate, pentaerythritol hexa (meth)acrylate, pentaerythritol tetra(meth)acrylate, and ditrimethylol propane tetra(meth)acrylate. Besides, multifunctional urethane(meth)acrylate can also be used. Specific examples may include M1100, M1200, M1210 and M1600 (Toagosei Co., Ltd.), and AH-600 and AT-600 (Kyoeisha Chemical Co., Ltd.).

An extremely small content of the acrylate compound in the first connection layer 2 tends to cause the difference in viscosity from the second connection layer 3 to become unclear, while an extremely large content thereof tends to increase curing shrinkage and reduce workability. Therefore, the content is preferably 2 to 70% by mass, and more preferably 10 to 50% by mass.

(Photo-Radical Polymerization Initiator)

As the photo-radical polymerization initiator, a publicly known photo-radical polymerization initiator can be appropriately selected and used. Examples of the publicly known photo-radical polymerization initiator may include an acetophenone-based photo-polymerization initiator, a benzyl ketal-based photo-polymerization initiator, and a phosphorus-based photo-polymerization initiator. Specific examples of the acetophenone-based photo-polymerization initiator may include 2-hydroxy-2-cyclohexyl acetophenone (IRGACURE 184, BASF Japan Ltd.), α-hydroxy-α,α'-dimethyl acetophenone (DAROCUR 1173, BASF Japan Ltd.), 2,2-dimethoxy-2-phenylacetophenone (IRGACURE 651, BASF Japan Ltd.), 4-(2-hydroxyethoxy)phenyl(2-hydroxy-2-propyl)ketone (IRGACURE 2959, BASF Japan Ltd.), and 2-hydroxy-1-{4-[2-hydroxy-2-methyl-propionyl]-benzyl}phenyl}-2-methyl-propane-1-one (IRGACURE 127, BASF Japan Ltd.). Examples of the benzyl ketal-based photo-polymerization initiator may include benzophenone, fluorenone, dibenzosuberone, 4-aminobenzophenone, 4,4'-diaminobenzophenone, 4-hydroxybenzophenone, 4-chlorobenzophenone, and 4,4'-dichlorobenzophenone. Also, 2-benzyl-2-dimethylamino-1-(4-morpholinophenyl)-butanone-1 (IRGACURE 369, BASF Japan Ltd.) can be used. Examples of the phosphorus-based photo-polymerization initiator may include bis(2,4,6-trimethylbenzoyl)-phenylphosphine oxide (IRGACURE 819, BASF Japan Ltd.), and (2,4,6-trimethylbenzoyl)-diphenylphosphone oxide (DAROCURE TPO, BASF Japan Ltd.).

An extremely small use amount of the photo-radical polymerization initiator with respect to 100 parts by mass of the acrylate compound causes the photo-radical polymerization not to sufficiently proceed, while an extremely large use amount thereof causes reduction in stiffness. Therefore the use amount is preferably 0.1 to 25 parts by mass, and more preferably 0.5 to 15 parts by mass.

(Conductive Particles)

As the conductive particles, any of conductive particles used in conventionally known anisotropic conductive films can be appropriately selected and used. Examples of such conductive particles may include metal particles such as nickel, cobalt, silver, copper, gold, and palladium particles or metal-coated resin particles. Two or more of these can also be used in combination.

An extremely small average particle diameter of the conductive particles tends to disable the varied height of wiring to be absorbed thereby increasing the resistance, while an extremely large average particle diameter tends to cause a short circuit. Therefore, the average particle diameter is preferably 1 to 10 µm, and more preferably 2 to 6 µm.

An extremely small amount of such conductive particles in the first connection layer 2 causes the number of captured particles to decrease thereby inhibiting the anisotropic conductive connection, while an extremely large amount thereof can lead to a short circuit. Therefore, the amount is preferably 50 to 50000 per 1 mm$^2$, and more preferably 200 to 30000 per 1 mm$^2$.

The first connection layer 2 may also include, as necessary, a film formation resin such as a phenoxy resin, an epoxy resin, an unsaturated polyester resin, a saturated polyester resin, a urethane resin, a butadiene resin, a polyimide resin, a polyamide resin, and a polyolefin resin. The second connection layer and the third connection layer may similarly include the above-described film formation resin.

An extremely thin layer thickness of the first connection layer 2 tends to reduce particle capturing efficiency, while an extremely thick layer thickness thereof tends to increase conduction resistance. Therefore, the layer thickness is preferably 1.0 to 6.0 µm, and more preferably 2.0 to 5.0 µm.

The first connection layer 2 may further include an epoxy compound and a thermal- or photo-, cationic or anionic polymerization initiator. In this case, as described later, the second connection layer 3 is preferably also the thermal- or photo-, cationic or anionic polymerizable resin layer containing an epoxy compound and a thermal- or photo-, cationic or anionic polymerization initiator. This enables the delamination strength to improve. The epoxy compound and the thermal- or photo-, cationic or anionic polymerization initiator will be described in the second connection layer 3.

In the first connection layer 2, as illustrated in FIG. 1, the conductive particles 4 preferably dig into the second connection layer 3 (in other words, the conductive particles 4 are preferably exposed on the surface of the first connection layer 2). This is because when the whole of the conductive particle is buried in the first connection layer 2, it is concerned that the resistance conduction becomes high. An extremely low degree of digging tends to decrease particle capturing efficiency, while an extremely high degree of digging tends to increase conduction resistance. Therefore, the degree of digging is preferably 10 to 90%, and more preferably 20 to 80%, of the average particle diameter of the conductive particles.

Also, in the first connection layer 2, the degree of cure of a first connection layer 2X in a region located between the conductive particles 4 and an outermost surface 2b of the first connection layer 2 is preferably lower than the degree of cure of a first connection layer 2Y in a region located between the conductive particles 4 adjacent to each other. This facilitates elimination of the first connection layer 2X during thereto-compression bonding of anisotropic conductive connection, thereby improving connection reliability. Here, the degree of cure is a numerical value defined as a decrease ratio of a vinyl group, and the degree of cure of the first connection layer 2X is preferably 40 to 80%, while the degree of cure of the first connection layer 2Y is preferably 70 to 100%.

It is noted that although the photo-radical polymerization when forming the first connection layer 2 may be performed in one stage (that is, light irradiation performed once), it may also be performed in two stages (that is, light irradiation performed twice). In this case, light exposure during the second stage is preferably performed from the other side of the first connection layer 2 under an oxygen-containing atmosphere (in the atmosphere), after the second connection layer 3 is formed on one side of the first connection layer 2. Accordingly, oxygen inhibits the radical polymerization reaction, thereby increasing the surface concentration of an uncured component. Thus, an effect of improving tack properties can be expected. Also, since the curing in two stages allows the polymerization reaction to be complicated, the sophisticated control of the flow properties of resins and particles can be expected to be enabled.

In such photo-radical polymerization in two stages, the degree of cure of the first connection layer 2X in the first stage is preferably 10 to 50%, and the degree of cure thereof in the second stage is preferably 40 to 80%. The degree of cure of the first connection layer 2Y in the first stage is preferably 30 to 90%, and the degree of cure in the thereof second stage is preferably 70 to 100%.

Also, when the photo-radical polymerization reaction when forming the first connection layer 2 is performed in two stages, only one type of radical polymerization initiator can be used, but two types of photo-radical polymerization initiators each having a different wavelength band in which the radical reaction is initiated are preferably used in order to improve tack properties. For example, it is preferable to use both of IRGACURE 369 (BASF Japan Ltd.) that initiates radical reaction with the light having a wavelength of 365 nm from an LED light source and IRGACURE 2959 (BASF Japan Ltd.) that initiates radical reaction with the light from a high pressure mercury lamp light source. Since the use of two different types of curing agents in this manner causes the connection of resins to become complicated, more sophisticated control of the behaviors of the thermal flow of resins during connection becomes possible. This facilitates exertion of the effects of the present invention in which while the particles are likely to be subjected to the force applied in a thickness direction during the pressing in the anisotropic conductive connection, the flow in a plane direction is suppressed.

Also, the minimum melt viscosity of the first connection layer 2 measured using a rheometer is higher than the minimum melt viscosity of the second connection layer 3. Specifically, the value of [minimum melt viscosity of first connection layer 2 (mPa·s)]/[minimum melt viscosity of second connection layer 3 (mPa·s)] is preferably 1 to 1000, and more preferably 4 to 400. It is noted that the preferable minimum melt viscosity of the former is 100 to 100000 mPa·s, and more preferably 500 to 50000 mPa·s, while the minimum melt viscosity of the latter is preferably 0.1 to 10000 mPa·s, and more preferably 0.5 to 1000 mPa·s.

The first connection layer 2 can be formed by allowing the conductive particles to adhere to the photo-radical polymerizable resin layer containing a photo-radical polymerizable acrylate and a photo-radical polymerization initiator by a method such as a film transfer method, a mold transfer method, an inkjet method, and an electrostatic adhesion method, and then irradiating the layer with UV light from one of a conductive particles side, an opposite side to the conductive particles side, and both sides. In particular, irradiated UV light only from the conductive particles side is preferred, since the degree of cure of the first connection layer 2X can be suppressed to a relatively low level.

<Second Connection Layer 3>

The second connection layer 3 includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Formation of the second connection layer 3 from the thermal polymerizable resin layer does not cause polymerization reaction of the second connection layer 3 to occur with the UV light irradiation when forming the first connection layer 2, and is thus preferred in terms of the simplicity of production and the stability of quality.

(Epoxy Compound)

When the second connection layer 3 is the thermal- or photo-, cationic or anionic polymerizable resin layer containing an epoxy compound and a thermal- or photo-, cationic or anionic polymerization initiator, a preferred example of the epoxy compound includes a compound or resin having two or more epoxy groups in the molecule. These may be either liquid or solid. Specific examples thereof may include publicly known epoxy resins such as: glycidyl ethers obtained by reacting epichlorhydrin with a polyhydric phenol such as bisphenol A, bisphenol F, bisphenol S, hexahydro bisphenol A, tetramethyl bisphenol A, diaryl bisphenol A, hydroquinone, catechol, resorcin, cresol, tetrabromo bisphenol A, trihydroxy biphenyl, benzophenone, bisresorcinol, bisphenol hexafluoroacetone, tetramethyl bisphenol A, tetramethyl bisphenol F, tris(hydroxyphenyl)methane, bixylenol, phenol novolac, and cresol novolac, or polyglycidyl ethers obtained by reacting epichlorhydrin with an aliphatic polyhydric alcohol such as glycerin, neopentyl glycol, ethylene glycol, propylene glycol, butylene glycol, hexylene glycol, polyethylene glycol, and polypropylene glycol; glycidyl ether esters obtained by reacting epichlorhydrin with a hydroxycarboxylic acid such as p-oxybenzoic acid and β-oxynaphthoic acid, or polyglycidyl esters obtained from a polycarboxylic acid such as phthalic acid, methylphthalic acid, isophthalic acid, terephthalic acid, tetrahydrophthalic acid, hexahydrophthalic acid, endomethylene tetrahydrophthalic acid, endomethylene hexahydrophthalic acid, trimellitic acid, and polymerized fatty acid; glycidyl amino glycidyl ethers obtained from aminophenol and amino alkyl phenol; glycidyl amino glycidyl esters obtained from an aminobenzoic acid; glycidyl amines obtained from aniline, toluidine, tribromoaniline, xylylenediamine, diaminocyclohexane, bisaminomethylcyclohexane, 4,4'-diaminodiphenylmethane, and 4,4'-diaminodiphenylsulfone; and epoxidized polyolefin. Also, a cycloaliphatic epoxy compound such as 3,4-epoxycyclohexenylmethyl-3',4'-epoxycyclohexene carboxylate may be used (Thermal Cationic Polymerization Initiator)

As the thermal cationic polymerization initiator, a publicly known thermal cationic polymerization initiator for an epoxy compound can be adopted. An example of such a thermal cationic polymerization initiator to be used is a substance that generates an acid capable of cationically polymerizing a cationically polymerizable compound with heat, and may include a publicly known iodonium salt, sulfonium salt, phosphonium salt, and ferrocenes. An aromatic sulfonium salt that exhibits favorable latency with respect to temperature can preferably be used. Preferred examples of the thermal cationic polymerization initiator may include diphenyliodonium hexafluoroantimonate, diphenyliodonium hexafluorophosphate, diphenyliodonium hexafluoroborate, triphenyl sulfonium hexafluoroantimonate, triphenyl sufonium hexafluorophosphate, and triphenyl sufonium hexafluoroborate. Specific examples thereof may include SP-150, SP-170, CP-66, and CP-77 produced by Adeka Corporation; CI-2855 and CI-2639 produced by Nippon Soda Co., Ltd.; SAN-AID SI-60 and SI-80 produced by Sanshin Chemical Industry Co., Ltd.; and CYRACURE-UVI-6990 and UVI-6974 produced by Union Carbide Corporation.

An extremely small added amount of the thermal cationic polymerization initiator tends to cause curing failure, while an extremely large added amount thereof tends to reduce a product life. Therefore, the added amount with respect to 100 parts by mass of the epoxy compound is preferably 2 to 60 parts by mass, and more preferably 5 to 40 parts by mass.

(Thermal Anionic Polymerization Initiator)

As the thermal anionic polymerization initiator, a publicly known thermal anionic polymerization initiator for an epoxy compound can be adopted. An example of such a thermal anionic polymerization initiator to be used is a substance that generates a base capable of anionically polymerizing an anionically polymerizable compound with heat, and may include a publicly known aliphatic amine-based compound, aromatic amine-based compound, secondary or tertiary amine-based compound, imidazole-based compound, polymercaptan-based compound, boron trifluoride-amine complex, dicyandiamide, and organic acid hydrazide. An encapsulated imidazole-based compound that exhibits favorable latency with respect to temperature can be preferably used. A specific example thereof may include NOVACURE HX3941HP produced by Asahi Kasei E-materials Corporation.

An extremely small added amount of the thermal anionic polymerization initiator tends to cause curing failure, while an extremely large added amount thereof tends to reduce a product life. Therefore, the added amount with respect to 100 parts by mass of the epoxy compound is preferably 2 to 60 parts by mass, and more preferably 5 to 40 parts by mass.

(Photo-Cationic Polymerization Initiator and Photo-Anionic Polymerization Initiator)

A publicly known photo-cationic polymerization initiator or photo-anionic polymerization initiator for an epoxy compound can be appropriately used.

(Acrylate Compound)

When the second connection layer 3 is the thermal- or photo-radical polymerizable resin layer containing an acrylate compound and a thermal- or photo-radical polymerization initiator, the acrylate compound to be used may be appropriately selected from the acrylate compounds described regarding the first connection layer 2.

(Thermal Radical Polymerization Initiator)

Also, examples of the thermal radical polymerization initiator may include an organic peroxide and an azo-based compound. However, an organic peroxide that does not generate nitrogen which causes air bubbles may be preferably used.

Examples of the organic peroxide may include methyl ethyl ketone peroxide, cyclohexanone peroxide, methyl cyclohexanone peroxide, acetyl acetone peroxide, 1,1-bis(tert-butylperoxy)3,3,5-trimethyl cyclohexane, 1,1-bis(tert-butylperoxy)cyclohexane, 1,1-bis(tert-hexylperoxy)3,3,5-trimethyl cyclohexane, 1,1-bis(tert-hexylperoxy) cyclohexane, 1,1-bis(tert-butylperoxy)cyclododecane, isobutyl peroxide, lauroyl peroxide, succinic acid peroxide, 3,5,5-trimethyl hexanoyl peroxide, benzoyl peroxide, octanoyl peroxide, stearoyl peroxide, diisopropyl peroxydicarbonate, dinormalpropyl peroxydicarbonate, di-2-ethylhexyl peroxydicarbonate, di-2-ethoxyethyl peroxydicarbonate, di-2-methoxybutyl peroxydicarbonate, bis-(4-tert-butyl cyclohexyl)peroxydicarbonate, ($\alpha,\alpha$-bis-neodecanoylperoxy)diisopropylbenzene, cumyl peroxyneodecanoate, octyl peroxyneodecanoate, hexyl peroxyneodecanoate, peroxyneodecanoic acid tert-butyl ester, peroxypivalic acid tert-hexyl ester, peroxypivalic acid tert-butyl ester, 2,5-dimethyl-2,5-bis(2-ethylhexanoylperoxy)hexane, 1,1,3,3-tetramethyl butyl peroxy-2-ethylhexanoate, peroxy-2-ethylhxanoic acid tert-hexyl ester, peroxy-2-ethylhxanoic acid tert-butyl ester, peroxy-3-methylpropionic acid tert-butyl ester, peroxylauric acid tert-butyl ester, tert-butylperoxy-3,5,5-trimethylhexanoate, tert-hexylperoxyisopropyl monocarbonate, tert-butylperoxyisopropyl carbonate, 2,5-dimethyl-2,5-bis(benzoylperoxy)hexane, peracetic acid tert-butyl ester, perbenzoic acid tert-hexyl ester, and perbenzoic acid tert-butyl ester. An organic peroxide added with a reducing agent may be used as a redox-based polymerization initiator.

Examples of the azo-based compound may include 1,1-azobis(cyclohexane-1-carbonitrile), 2,2'-azobis(2-methylbutyronitrile), 2,2'-azobisbutyronitrile, 2,2'-azobis(2,4-dimethyl-valeronitrile), 2,2'-azobis(2,4-dimethyl-4-methoxyvaleronitrile), 2,2'-azobis(2-amidino-propane) hydrochloride, 2,2'-azobis[2-(5-methyl-2-imidazoline-2-yl) propane]hydrochloride, 2,2'-azobis[2-(2-imidazoline-2-yl) propane]hydrochloride, 2,2'-azobis[2-(5-methyl-2-imidazoline-2-yl)propane], 2,2'-azobis[2-methyl-N-(1,1-bis (2-hydroxymethyl)-2-hydroxyethyl)propionamide], 2,2'-azobis[2-methyl-N-(2-hydroxyethyl)propionamide], 2,2'-azobis(2-methyl-propionamide)dihydrate, 4,4'-azobis(4-cyano-valeric acid), 2,2'-azobis(2-hydroxymethyl propionitrile), 2,2'-azobis(2-methylpropionic acid)dimethyl ester (dimethyl 2,2'-azobis(2-methylpropionate)), and cyano-2-propylazoformamide.

An extremely small use amount of the thermal radical polymerization initiator causes curing failure, while an extremely large amount thereof reduces a product life. Therefore, the use amount with respect to 100 parts by mass of the acrylate compound is preferably 2 to 60 parts by mass, and more preferably 5 to 40 parts by mass.

(Photo-Radical Polymerization Initiator)

As the photo-radical polymerization initiator for an acrylate compound, a publicly known photo-radical polymerization initiator can be used.

An extremely small use amount of the photo-radical polymerization initiator causes curing failure, while an extremely large amount thereof reduces a product life. Therefore, the use amount with respect to 100 parts by mass of the acrylate compound is preferably 2 to 60 parts by mass, and more preferably 5 to 40 parts by mass.

(Third Connection Layer 5)

Figure 5:
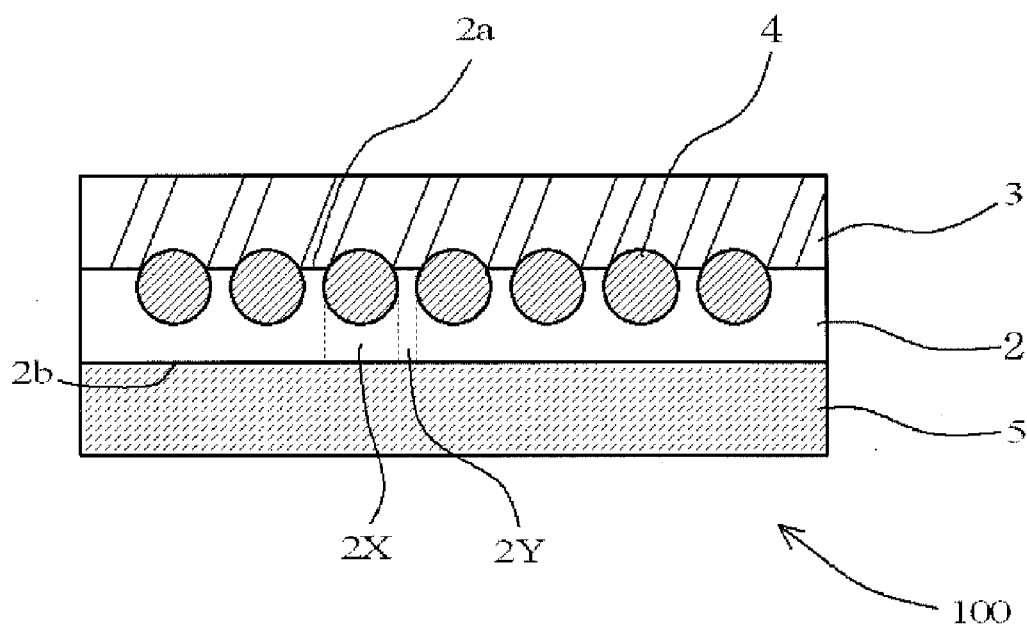
FIG. 5 is a cross-sectional view of the anisotropic conductive film according to the present invention.

While the two-layer structured anisotropic conductive film of FIG. 1 has been described above, a third connection layer 5 may be formed on the other side of the first connection layer 2, as illustrated in FIG. 5. Accordingly, there can be obtained an effect that the flow properties of the whole layer can be more sophisticatedly controlled. Here, the structure of the third connection layer 5 may be identical to that of the second connection layer 3. That is, the third connection layer 5 includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Such a third connection layer 5 may be formed on the other side of the first connection layer after the formation of the second connection layer on one side of the first connection layer, or may be previously formed on the other side (a side on which the second connection layer is not to be formed) of the first connection layer or a precursor of the first connection layer before the formation of the second connection layer.

<<Production Method of Anisotropic Conductive Film>>

The method of producing the anisotropic conductive film according to the present invention includes a production method of performing photo-radical polymerization reaction in a single stage, and a production method of performing photo-radical polymerization reaction in two stages.

<Production Method of Performing Photo-Radical Polymerization Reaction in a Single Stage>

An example of producing the anisotropic conductive film of FIG. 1 (FIG. 4B) by photo-radical polymerization in a single stage will be described. This production example includes steps (A) to (C) below.

(Step (A))

Figure 2:
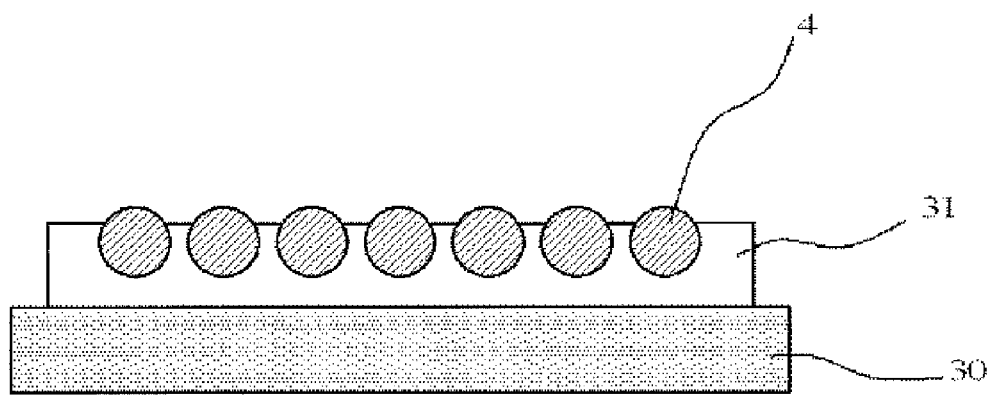
FIG. 2 is an illustrative view of a production step (A) of the anisotropic conductive film according to the present invention.

As illustrated in FIG. 2, the conductive particles 4 are arranged in a single layer, on a photo-radical polymerizable resin layer 31 containing a photo-radical polymerizable acrylate and a photo-radical polymerization initiator, which is formed on a release film 30 as necessary. An arranging technique of the conductive particles 4 is not particularly limited. As the arranging technique, there can be adopted a method of using biaxial stretching operation to a cast polypropylene film disclosed in Example 1 of Japanese patent No. 4789738, a method of using a mold disclosed in Japanese Patent Application Laid-Open No. 2010-33793, and the like. It is noted that as the degree of the arrangement, the particles are preferably arranged so as to be two-dimensionally spaced apart from each other by approximately 1 to 100 μm, in consideration of the size of a connection object, the conduction reliability, the insulating properties, the particle capturing efficiency and the like.

(Step (B))

Figure 3A:
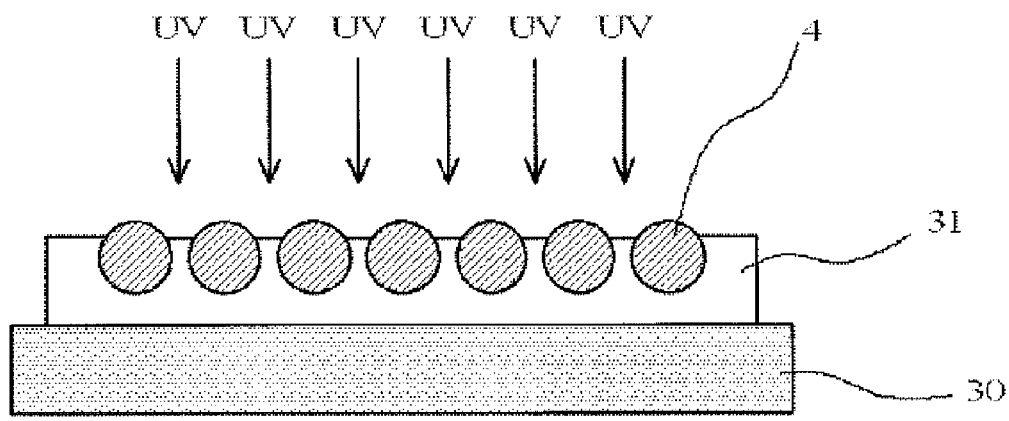
FIG. 3A is an illustrative view of a production step (B) of the anisotropic conductive film according to the present invention.
Figure 3B:
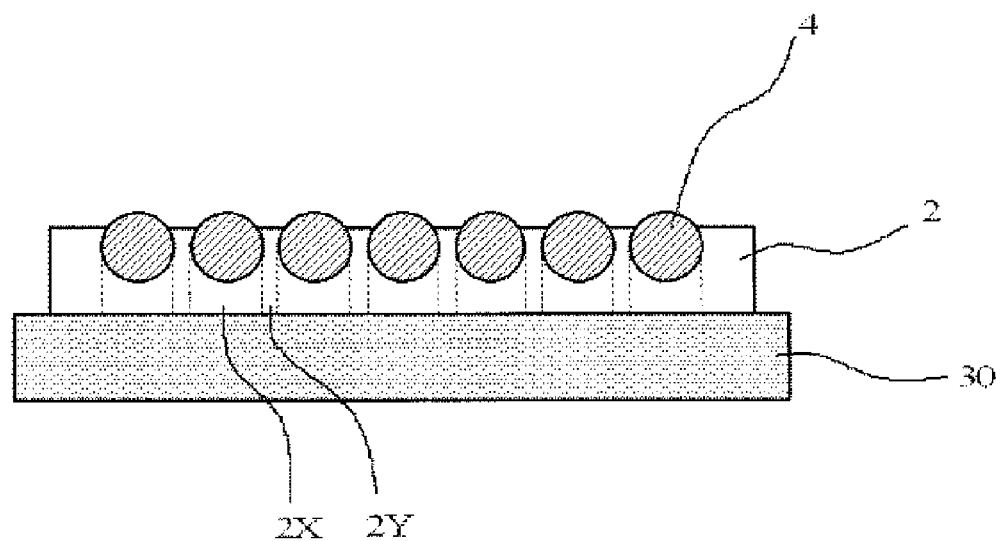
FIG. 3B is an illustrative view of the production step (B) of the anisotropic conductive film according to the present invention.

Next, as illustrated in FIG. 3A, the photo-radical polymerizable resin layer 31 on which the conductive particles 4 are arranged is irradiated with UV light from the conductive particles side, to initiate photo-radical polymerization reaction, thereby forming a first connection layer 2 having a surface on which the conductive particles 4 are fixed. Accordingly, as illustrated in FIG. 3B, the degree of cure of a first connection layer 2X in a region located between the conductive particles 4 and an outermost surface of the first connection layer 2 can be lower than the degree of cure of a first connection layer 2Y in a region located between the conductive particles 4 adjacent to each other. This ensures reduction in curing properties on a back side of the particles to facilitate the pressing during connection, and can also provide an effect of inhibiting the flow of the particles.

(Step (C))

Figure 4A:
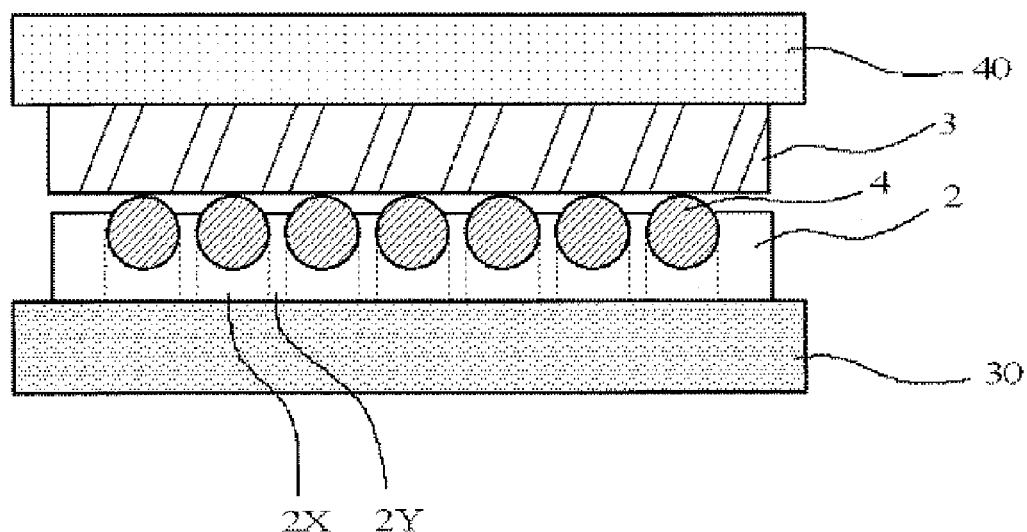
FIG. 4A is an illustrative view of a production step (C) of the anisotropic conductive film according to the present invention.
Figure 4B:
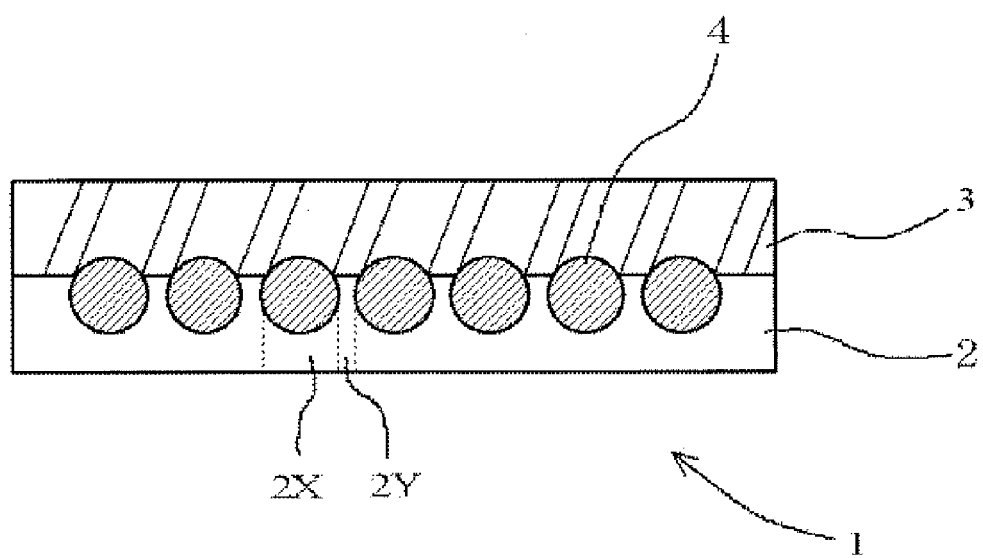
FIG. 4B is an illustrative view of the production step (C) of the anisotropic conductive film according to the present invention.

Next, as illustrated in FIG. 4A, on a conductive particles 4-side surface of the first connection layer 2, a second connection layer 3 is formed. The second connection layer 3 includes the thermal- or photo-, cationic or anionic polymerizable resin layer containing an epoxy compound and a thermal- or photo-, cationic or anionic polymerization initiator, or the thermal- or photo-radical polymerizable resin layer containing an acrylate compound and a thermal- or photo-radical polymerization initiator. In a specific example, the second connection layer 3 formed in an ordinary method on a release film 40 is placed on the conductive particles 4-side surface of the first connection layer 2, and is subjected to thermo-compression bonding to a degree that does not cause excessive thermal polymerization. Then, the release films 30 and 40 are removed, so that the anisotropic conductive film of FIG. 4B can be obtained.

It is noted that an anisotropic conductive film 100 of FIG. 5 can be obtained by executing the following step (Z), after the step (C).

(Step (Z))

On the opposite surface to the conductive particles-side of the first connection layer, the third connection layer is preferably formed, in a similar manner to that for the second connection layer. The third connection layer includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. In this manner, the anisotropic conductive film of FIG. 5 can be obtained.

Furthermore, the anisotropic conductive film 100 of FIG. 5 can also be obtained by executing the following step (a), prior to the step (A), without executing the step (Z).

(Step (a))

A step of forming, on one surface of the photo-radical polymerizable resin layer containing the acrylate compound and the photo-radical polymerization initiator, the third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. In this case, in the step (A), the conductive particles are arranged in a single layer on the other surface of the photo-radical polymerizable resin layer. Subsequently to this step (a), the steps (A), (B), and (C) are executed, so that the anisotropic conductive film 100 of FIG. 5 can be obtained.

(Production Method of Performing Photo-Radical Polymerization Reaction in Two Stages)

Next, an example of producing the anisotropic conductive film of FIG. 1 (FIG. 4B) by photo-radical polymerization in two stages will be described. This production example includes the following steps (AA) to (DD).

(Step (AA))

Figure 6:
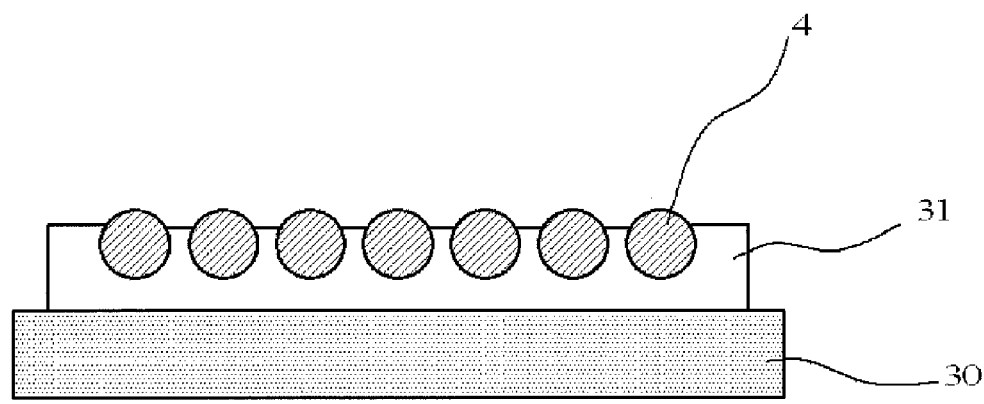
FIG. 6 is an illustrative view of a production step (AA) of the anisotropic conductive film according to the present invention.

As illustrated in FIG. 6, conductive particles 4 are arranged in a single layer, on a photo-radical polymerizable resin layer 31 containing a photo-radical polymerizable acrylate and a photo-radical polymerization initiator, which is formed on a release film 30 as necessary. An arranging technique of the conductive particles 4 is not particularly limited. As the arranging technique, there can be adopted a method of using biaxial stretching operation to a cast polypropylene film disclosed in Example 1 of Japanese patent No. 4789738, a method of using a mold disclosed in Japanese Patent Application Laid-Open No. 2010-33793, and the like. It is noted that as the degree of the arrangement, the particles are preferably arranged so as to be two-dimensionally spaced apart from each other by approximately 1 to 100 μm, in consideration of the size of a connection object, the conduction reliability, the insulating properties, the particle capturing efficiency and the like.

(Step (BB))

Figure 7A:
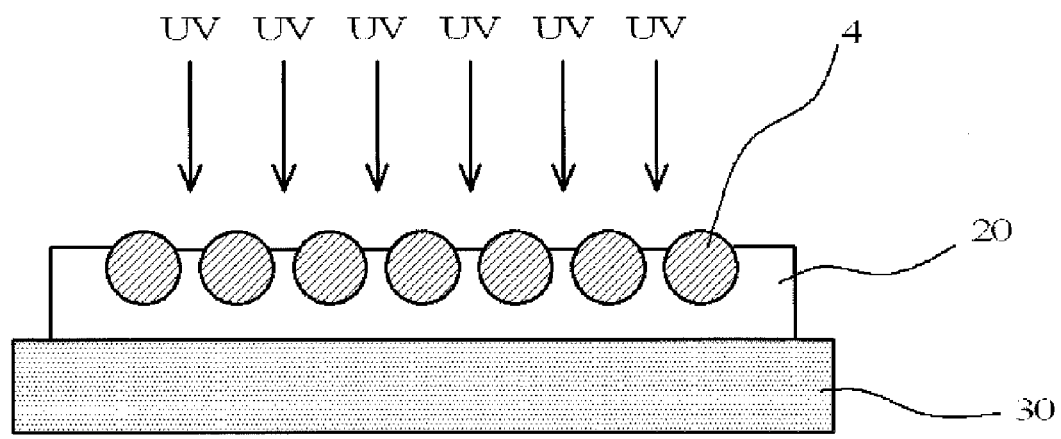
FIG. 7A is an illustrative view of a production step (BB) of the anisotropic conductive film according to the present invention.
Figure 7B:
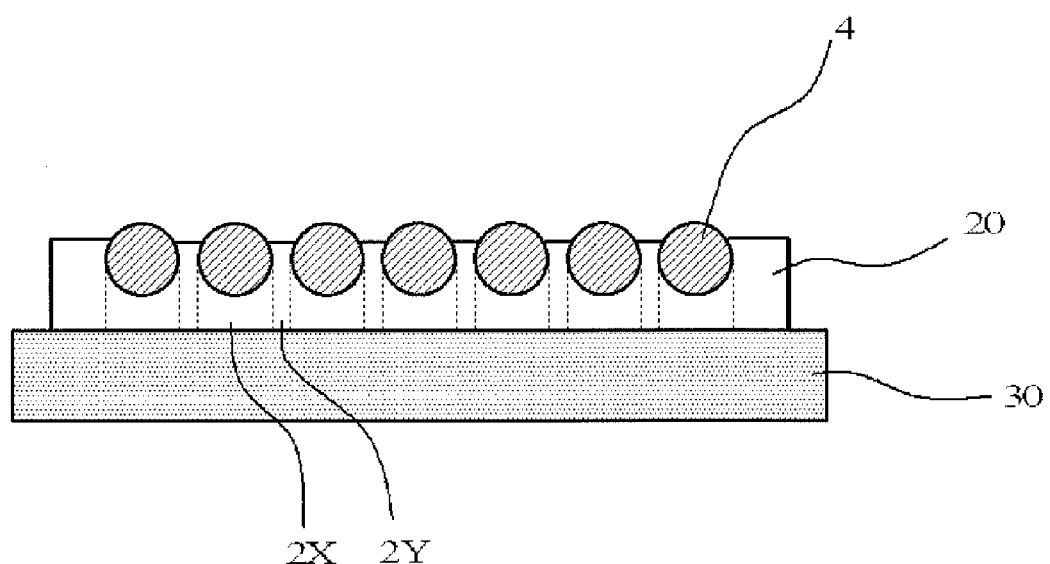
FIG. 7B is an illustrative view of the production step (BB) of the anisotropic conductive film according to the present invention.

Next, as illustrated in FIG. 7A, the photo-radical polymerizable resin layer 31 on which the conductive particles 4 are arranged is irradiated with UV light from the conductive particles side, to initiate photo-radical polymerization reaction, thereby forming a temporal first connection layer 20 having a surface on which the conductive particles 4 are temporarily fixed. Accordingly, as illustrated in FIG. 7B, the degree of cure of a first connection layer 2X in a region located between the conductive particles 4 and an outermost surface of the temporal first connection layer 20 can be lower than the degree of cure of a first connection layer 2Y in a region located between the conductive particles 4 adjacent to each other.

(Step (CC))

Figure 8A:
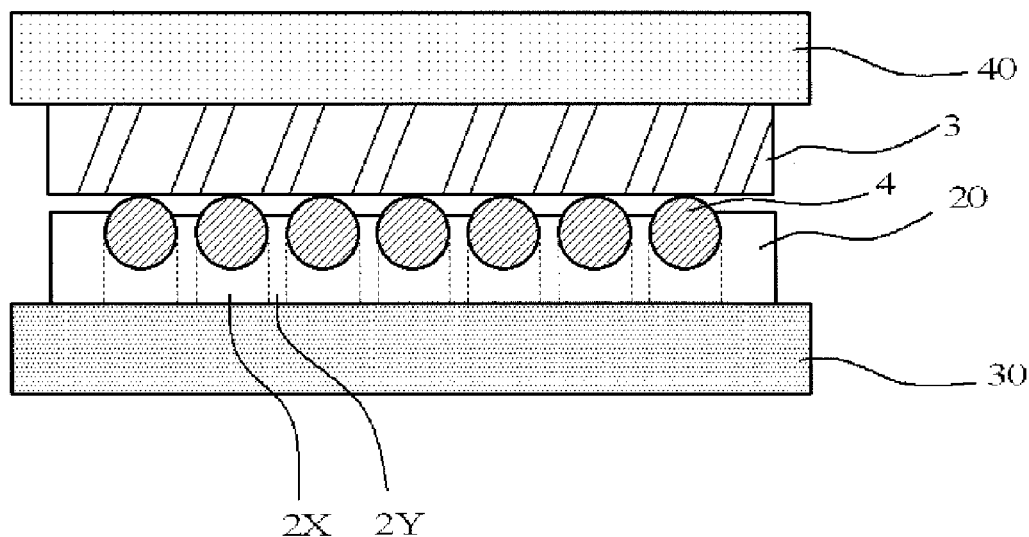
FIG. 8A is an illustrative view of a production step (CC) of the anisotropic conductive film according to the present invention.
Figure 8B:
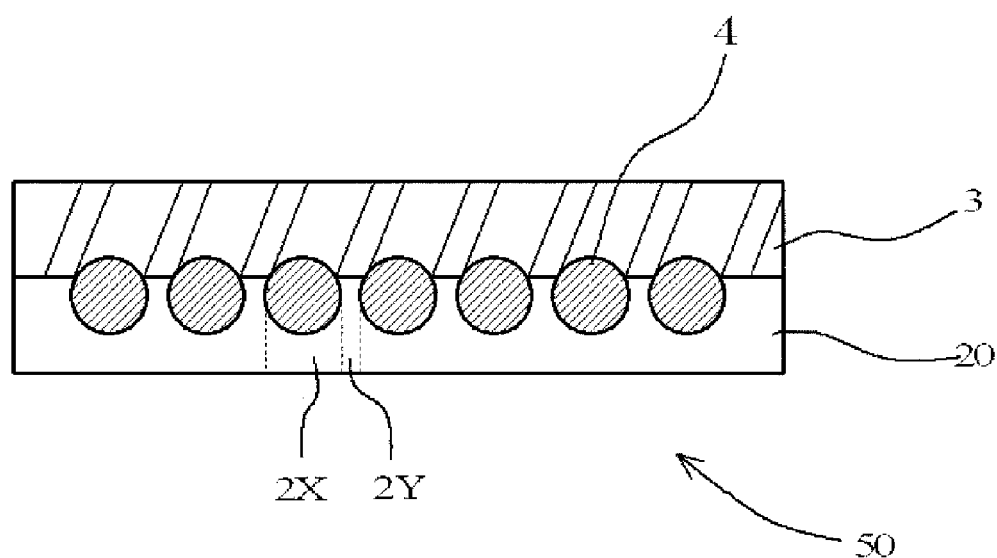
FIG. 8B is an illustrative view of the production step (CC) of the anisotropic conductive film according to the present invention.

Next, as illustrated in FIG. 8A, on a conductive particles 4-side surface of the temporal first connection layer 20, a second connection layer 3 is formed. The second connection layer 3 includes a thermal cationic or thermal anionic polymerizable resin layer containing an epoxy compound and a thermal cationic or thermal anionic polymerization initiator, or a thermal cationic or thermal anionic polymerizable resin layer containing an acrylate compound and a thermal cationic or thermal anionic polymerization initiator. In a specific example, the second connection layer 3 formed in an ordinary method on a release film 40 is placed on the conductive particles 4-side surface of the temporal first connection layer 20, and is subjected to thermo-compression bonding to a degree that does not cause excessive thermal polymerization. Then, the release films 30 and 40 are removed, so that a temporal anisotropic conductive film 50 of FIG. 8B can be obtained.

(Step DD)

Figure 9A:
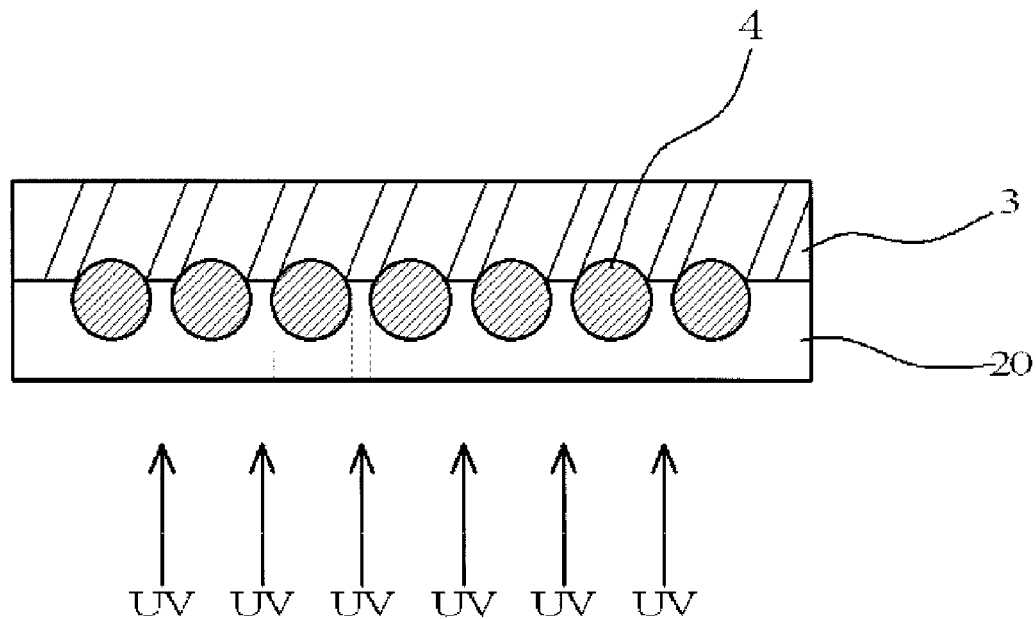
FIG. 9A is an illustrative view of a production step (DD) of the anisotropic conductive film according to the present invention.
Figure 9B:
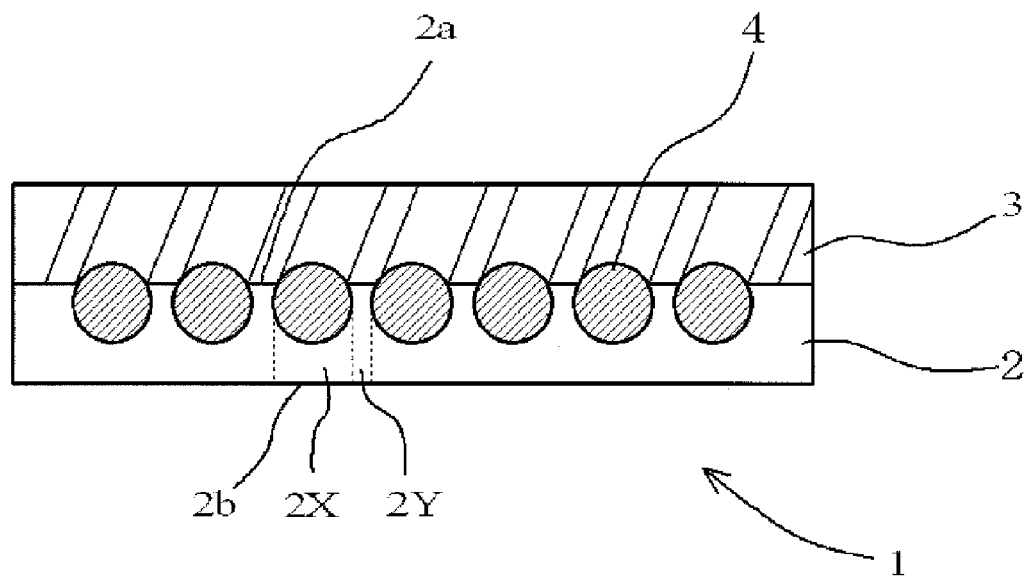
FIG. 9B is an illustrative view of the production step (DD) of the anisotropic conductive film according to the present invention.

Next, as illustrated in FIG. 9A, the temporal first connection layer 20 is irradiated with UV light from an opposite side to the second connection layer 3 to initiate photo-radical polymerization reaction, to permanently cure the temporal first connection layer 20 to form a first connection layer 2. Accordingly, the anisotropic conductive film 1 of FIG. 9B can be obtained.

It is noted that when photo-radical polymerization in two stages is performed, the anisotropic conductive film 100 of FIG. 5 can be obtained by executing the following step (Z), after the step (DD).

(Step (Z))

On the opposite surface to the conductive particles-side of the first connection layer, a third connection layer is formed, preferably in a similar manner to that for the second connection layer. The third connection layer includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Accordingly, the anisotropic conductive film of FIG. 5 can be obtained.

Furthermore, the anisotropic conductive film 100 of FIG. 5 can also be obtained by executing the following step (a), prior to the step (AA), without executing the step (Z).

(Step (a))

A step of forming, on one surface of the photo-radical polymerizable resin layer containing the acrylate compound and the photo-radical polymerization initiator, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. In this case, in the step (A), conductive particles are arranged in a single layer on the other surface of the photo-radical polymerizable resin layer. Subsequently to this step (a), the steps (AA) to (DD) are executed, so that the anisotropic conductive film 100 of FIG. 5 can be obtained. In this case, as the polymerization initiator used when forming the second connection layer, the thermal polymerization initiator is preferably applied. In the case of the photo-polymerization initiator, it is concerned that adverse effects are exerted on the product life as an anisotropic conductive film and the stability of connection and a connection structure in terms of the steps.

<<Connection Structure>>

The anisotropic conductive film obtained in this manner can be preferably applied when connecting a first electronic component such as an IC chip and an IC module to a second electronic component such as a flexible substrate and a glass substrate by anisotropic conductive connection. A connection structure obtained in this manner is also part of the present invention. In this case, it is preferable that the first connection layer side of the anisotropic conductive film be positioned on a side of the second electronic component such as a flexible substrate, and the second connection layer side thereof be positioned on a side of the first electronic component such as an IC chip, in terms of the improvement of connection reliability.

EXAMPLES

Hereinafter, the present invention will be specifically described by referring to examples below.

Examples 1 to 6 and Comparative Examples 1 to 5

A two-layer structured anisotropic conductive film was prepared by arranging conductive particles in accordance with one of the operation of Example 1 in Japanese patent No. 4789738, the operation in Japanese Patent Application Laid-Open No. 2010-33793, and the operation in Japanese Patent Application Laid-Open No. 2010-123418, and laminating the first connection layer to the second connection layer in accordance with the formulation indicated in Table 1. In Table 1, "4789738" of the arrangement method of conductive particles means Japanese Patent No. 4789738, while "2010-33793" and "2010-123418" mean "Japanese Patent Application Laid-Open No. 2010-33793" and "Japanese Patent Application Laid-Open No. 2010-123418," respectively.

Specifically, first, an acrylate compound and a photo-radical polymerization initiator or the like were put in ethyl acetate or toluene to prepare a mixed liquid having a solid content of 50% by mass. A polyethylene terephthalate film having a thickness of 50 μm was coated with this mixed liquid to have a dried thickness of 5 μm, and dried in an oven at 80° C. for 5 minutes. Accordingly, a photo-radical polymerizable resin layer that is a precursor of the first connection layer was formed.

Next, conductive particles (Ni/Au plated resin particles, AUL704, Sekisui Chemical Co., Ltd.) having an average particle diameter of 4 μm were arranged spaced apart from each other by 5 μm in a single layer, on the obtained photo-radical polymerizable resin layer. Furthermore, the photo-radical polymerizable resin layer was irradiated with UV light having a wavelength of 365 nm and an integrated light quantity of 4000 mL/cm$^2$ from a side of the conductive particles, thereby forming the first connection layer having a surface on which the conductive particles were fixed.

A thermosetting resin and a latent curing agent or the like were put in ethyl acetate or toluene to prepare a mixed liquid having a solid content of 50% by mass. A polyethylene terephthalate film having a thickness of 50 μm was coated with this mixed liquid to have a dried thickness of 12 μm, and dried in an oven at 80° C. for 5 minutes. Accordingly, the second connection layer was formed.

The first connection layer and the second connection layer obtained in this manner were laminated to each other so that the conductive particles were located inside the laminated layers, thereby to obtain the anisotropic conductive film.

Using the obtained anisotropic conductive film, an IC chip having a size of 0.5×1.8×20.0 mm (bump size 30×85 bump height 15 μm, bump pitch 50 μm) was mounted on a glass wiring board (1737 F) having a size of 0.5×50×30 mm produced by Corning Incorporated under the conditions of 180° C., 80 MPa and 5 seconds, thereby to obtain a connection structure sample body.

The obtained connection structure sample body was tested and evaluated for "minimum melt viscosity," "mounting particle capturing efficiency," "conduction reliability," and "insulating properties," as described below. The obtained results are shown in Table 1. Furthermore, "tack force" on a side of the first connection layer of the anisotropic conductive film according to each of Example 1 and Comparative Example 4 was evaluated as described below. The obtained results are indicated in Table 1.

"Minimum Melt Viscosity"

The minimum melt viscosity of each of the first connection layer and the second connection layer constituting the connection structure sample body was measured using a rotational rheometer (TA Instruments, Inc.), under the conditions of a temperature increasing rate of 10° C./minute, a measurement pressure of 5 g constant, and a used measurement plate diameter of 8 mm.

"Mounting Particle Capturing Efficiency"

The ratio of the "particle amount that is actually captured on the bumps of the connection structure sample body after heating and pressurizing (after actual mounting)" to the "theoretical particle amount that exists on the pumps of the connection structure sample body before heating and pressurizing" was calculated according to the following formula. For practical purposes, 50% or more is desirable.

Mounting particle capturing efficiency (%)={([Particle amount on bumps after heating and pressurizing]/[Particle amount on bumps before heating and pressurizing]}×100

"Conduction Reliability"

The connection structure sample body was allowed to stand in a high temperature and high humidity environment of 85° C. and 85% RH, and taken out at 100 hours intervals to check the increase of conduction resistance. The time when the conduction resistance exceeded 50Ω was defined as a failure occurrence time. For practical purposes, 1000 hours or longer is desirable.

"Insulating Properties"

The short circuit occurrence rate in a 7.5 μm-spaced comb TEG pattern was calculated. For practical purposes, 100 ppm or less is desirable.

"Tack Force"

Using a tack test machine (TAC II, Rhesca Co., Ltd.), a probe was pressed against the first connection layer side of the anisotropic conductive film for measurement, in an atmosphere at 22° C., under the measurement conditions of a probe diameter of 5 mm (stainless mirror surface, cylindrical), a pressing load of 196 kgf, a pressing rate of 30 mm/min, and a release rate of 5 mm/min. The peak strength in the measurement chart was defined as a tack force (kPa).

TABLE 1

| | | | | Example | | | | | |
|---|---|---|---|---|---|---|---|---|---|
| | | | | 1 | 2 | 3 | 4 | 5 | 6 |
| Fist Connection Layer | Phenoxy Resin | YP-50 | Nippon Steel & Sumikin Chemical Co., Ltd. | 60 | 80 | 60 | 60 | 60 | 60 |
| | Epoxy Resin | jER828 | Mitsubishi Chemical Corporation | | | | | 10 | |
| | Acrylate | EB600 | Daicel-Allnex Ltd. | 40 | 20 | 40 | 40 | 40 | 40 |
| | Photo-Radical Polymerization Initiator | IRGACURE 369 | BASF Japan Ltd. | 2 | 2 | 2 | 2 | 2 | 2 |
| | Organic Peroxide | PERHEXYLZ | NOF Corporation | | | | | | |
| | Thermal Cationic Polymerization Initiator | SI-60L | Sanshin Chemical Industry Co., Ltd. | | | | | 2 | |
| | Silica Fine Particles | AEROSIL RY200 | Nippon Aerosil Co., Ltd. | | | | | | |
| | Arrangement Form of Conductive Particles | AUL704 | Sekisui Chemical Co., Ltd. | Uniform | Uniform | Uniform | Uniform | Uniform | Uniform |
| Arranging Method of Conductive Particles | | Patent No. or Patent Laid-Open No. | | 4,789,738 | 4,789,738 | 4,789,738 | 4,789,738 | 4,789,738 | 2010-33793 |
| UV irradiation | | Performed or not | | Yes | Yes | Yes | Yes | Yes | Yes |
| | | Direction | | Particle Side | Particle Side | Particle Side | Particle Side | Particle Side | Particle Side |
| Minimum Melt Viscosity of First Connection Layer | | [mPa · s]After UV Irradiation for Examples 1 and 2 | | 20000 | 2000 | 20000 | 20000 | 20000 | 20000 |
| Second Connection Layer | Phenoxy Resin | YP-50 | Nippon Steel & Sumikin Chemical Co., Ltd. | 60 | 60 | 80 | 60 | 60 | 60 |
| | Epoxy Resin | jER828 | Mitsubishi Chemical Corporation | 40 | 40 | 20 | | 40 | 40 |

TABLE 1-continued

|  |  |  |  | Example 1 | Example 2 | Example 3 | Example 4 | Example 5 | Example 6 |
|---|---|---|---|---|---|---|---|---|---|
|  | Thermal Cationic Polymerization Initiator | SI-60L | Sanshin Chemical Industry Co., Ltd. | 2 | 2 | 2 |  | 2 | 2 |
|  | Acrylate | EB600 | Daicel-Allnex Ltd,. |  |  |  | 40 |  |  |
|  | Organic Peroxide | PERHEXYLZ | NOF Corporation |  |  |  | 2 |  |  |
| Minimum Melt Viscosity of Second Connection Layer |  |  | [mPa · s] | 500 | 500 | 50 | 500 | 500 | 500 |
| [Minimum Melt Viscosity of First Connection Layer]/[Minimum Melt Viscosity of Second Connection Layer] |  |  |  | 40 | 4 | 400 | 40 | 40 | 40 |
| Tack Face |  |  | [kPa] | 10 | — | — | — | — | — |
| Mounting Particle Capturing Efficiency |  |  | [%] | 70 | 50 | 80 | 70 | 70 | 70 |
| Conduction reliability |  |  | [hr] | ≥1000 | ≥1000 | ≥1000 | ≥1000 | ≥1000 | ≥1000 |
| Insulating Properties (Rate of Occurrence of Short Circuit) |  |  | [ppm] | 30 | 100 | 10 | 10 | 30 | 30 |

|  |  |  |  | Comparative Example 1 | Comparative Example 2 | Comparative Example 3 | Comparative Example 4 | Comparative Example 5 |
|---|---|---|---|---|---|---|---|---|
| First Connection Layer | Phenoxy Resin | YP-50 | Nippon Steel & Sumikin Chemical Co., Ltd. | 60 | 60 | 60 | 60 | 60 |
|  | Epoxy Resin | jER828 | Mitsubishi Chemical Corporation |  |  |  |  |  |
|  | Acrylate | EB600 | Daicel-Allnex Ltd. | 40 | 40 | 40 | 40 | 40 |
|  | Photo-Radical Polymerization Initiator | IRGACURE 369 | BASF Japan Ltd. |  |  |  | 2 | 2 |
|  | Organic Peroxide | PERHEXYLZ | NOF Corporation | 2 | 2 | 2 |  |  |
|  | Thermal Cationic Polymerization Initiator | SI-60L | Sanshin Chemical Industry Co., Ltd. |  |  |  |  |  |
|  | Silica Fine Particles | AEROSIL RY200 | Nippon Aerosil Co., Ltd. |  |  | 50 |  |  |
|  | Arrangement Form of Conductive Particles | AUL704 | Sekisui Chemical Co., Ltd. | Random | Uniform | Uniform | Uniform | Uniform |
| Arranging Method of Conductive Particles |  | Patent No. or Patent Laid-Open No. |  | 2010-123418 | 4,789,738 | 4,789,738 | 4,789,738 | 4,789,738 |
| UV irradiation |  | Performed or not |  | No | No | No | Yes | Yes |
|  |  | Direction |  | — | — | — | Adhesive Layer Side | Both Sides |
| Minimum Melt Viscosity of First Connection Layer |  | [mPa · s]After UV Irradiation for Examples 1 and 2 |  | 500 | 500 | 2000 | 20000 | 20000 |
| Second Connection Layer | Phenoxy Resin | YP-50 | Nippon Steel & Sumikin Chemical Co., Ltd. | 60 | 60 | 60 | 60 | 60 |
|  | Epoxy Resin | jER828 | Mitsubishi Chemical Corporation | 40 | 40 | 40 | 40 | 40 |
|  | Thermal Cationic Polymerization Initiator | SI-60L | Sanshin Chemical Industry Co., Ltd. | 2 | 2 | 2 | 2 | 2 |
|  | Acrylate | EB600 | Daicel-Allnex Ltd,. |  |  |  |  |  |
|  | Organic Peroxide | PERHEXYLZ | NOF Corporation |  |  |  |  |  |
| Minimum Melt Viscosity of Second Connection Layer |  |  | [mPa · s] | 500 | 500 | 500 | 500 | 500 |
| [Minimum Melt Viscosity of First Connection Layer]/[Minimum Melt Viscosity of Second Connection Layer] |  |  |  | 1 | 1 | 4 | 40 | 40 |
| Tack Face |  |  | [kPa] | — | — | — | 2 | — |
| Mounting Particle Capturing Efficiency |  |  | [%] | 20 | 20 | 50 | 70 | 70 |
| Conduction reliability |  |  | [hr] | 700 | 700 | 200 | 500 | 400 |
| Insulating Properties (Rate of Occurrence of Short Circuit) |  |  | [ppm] | 3000 | 30 | 30 | 30 | 30 |

As seen from Table 1, with respect to the anisotropic conductive films of Examples 1 to 6, practically preferred results were shown in all evaluation items of mounting particle capturing efficiency, conduction reliability, and insulating properties.

On the contrary, the anisotropic conductive film of Comparative Example 1 was configured such that UV irradiation was not performed to the resin layer corresponding to the first connection layer of the examples, and the conductive particles were randomly arranged. Accordingly, there were problems in mounting particle capturing efficiency, conduction reliability, and insulating properties. The anisotropic conductive film of Comparative Example 2 was configured such that the conductive particles were uniformly arranged, but UV irradiation was not performed. Accordingly, there were problems in mounting particle capturing efficiency and conduction reliability. The anisotropic conductive film of Comparative Example 3 was configured such that silica fine particles were formulated in the anisotropic conductive film of Comparative Example 2 to increase the viscosity. Accordingly, insulating properties were improved, but there were still problems in mounting particle capturing efficiency and conduction reliability. With respect to the anisotropic conductive film of Comparative Example 4, since UV irradiation was performed from the adhesive layer side of the first connection layer, the minimum melt viscosity of the first connection layer in the region located below the conductive particles increased, thereby causing reduction in pressing properties of the conductive particles. Thus, there was a problem in conduction reliability. With respect to the anisotropic conductive film of Comparative Example 5, since UV irradiation was performed from both sides, there was a problem in conduction reliability.

It is noted that when comparing the tack force of the anisotropic conductive film of Example 1 with that of Comparative Example 4, the anisotropic conductive film of Comparative Example 4 exhibited a lower tack force. This shows that UV irradiation from the conductive particles side of the first connection layer when producing the anisotropic conductive film relatively reduces the degree of cure of the first connection layer located below (on the back side of) the conductive particles.

From the above, the curing degree of the first connection layer differs between the front and back surfaces depending on the surface subjected to light irradiation. In other words, the particles exist in a region where this difference in the curing degree was caused. This means that there is no problem in the mobility in a thickness direction (pressing is possible), while side-to-side movement is suppressed (a short circuit caused by local reduction in flow properties is inhibited).

INDUSTRIAL APPLICABILITY

The anisotropic conductive film according to the present invention has a two-layer structure in which a first connection layer obtained by photo-radical polymerization of a photo-radical polymerizable resin layer containing an acrylate compound and a photo-radical polymerization initiator is laminated to a second connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator. Furthermore, conductive particles for anisotropic conductive connection are arranged in a single layer on a second connection layer-side surface of the first connection layer. For this reason, favorable conduction reliability, insulating properties, and particle capturing efficiency are exhibited. Therefore, the anisotropic conductive film according to the present invention is useful for anisotropic conductive connection of an electronic component such as an IC chip to a wiring board. The narrowing of wiring in such an electronic component is in progress. The present invention particularly exerts its effects in contributing to such technical progress.

REFERENCE SIGNS LIST 1, 100 anisotropic conductive film
2, 2X, 2Y first connection layer
3 second connection layer
4 conductive particle
5 third connection layer
30, 40 release film
20 temporal first connection layer
31 photo-radical polymerizable resin layer
50 temporal anisotropic conductive film

The invention claimed is:

1. An anisotropic conductive film comprising a first connection layer, and a second connection layer formed on one surface of the first connecting layer, wherein
    the first connection layer is obtained by photo-radical polymerization of a photo-radical polymerizable resin layer containing an acrylate compound and a photo-radical polymerization initiator,
    the second connection layer includes a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator, and
    conductive particles for anisotropic conductive connection are arranged in a single layer on a second connection layer-side surface of the first connection layer.

2. The anisotropic conductive film according to claim 1, wherein the second connection layer contains an acrylate compound, a thermal radical polymerization initiator, and a photo-radical polymerization initiator.

3. The anisotropic conductive film according to claim 1, wherein the first connection layer further contains an epoxy compound and a thermal- or photo-, cationic or anionic polymerization initiator, or an acrylate compound and a thermal- or photo-radical polymerization initiator.

4. The anisotropic conductive film according to claim 1, wherein the conductive particles dig into the second connection layer.

5. The anisotropic conductive film according to claim 1, wherein in the first connection layer, a degree of cure of the first connection layer in a region located between the conductive particles and an outermost surface of the first connection layer is lower than a degree of cure of the first connection layer in a region located between the conductive particles adjacent to each other.

6. The anisotropic conductive film according to claim 1, wherein the first connection layer has a minimum melt viscosity higher than that of the second connection layer.

7. A method of producing the anisotropic conductive film according to claim 1, comprising following steps (A) to (C):
    Step (A)
        a step of arranging conductive particles in a single layer, on a photo-radical polymerizable resin layer containing an acrylate compound and a photo-radical polymerization initiator;
    Step (B)
        a step of irradiating the photo-radical polymerizable resin layer on which the conductive particles are arranged, with UV light, to initiate photo-radical polymerization reaction, so as to form a first connection layer having a surface on which the conductive particles are fixed; and
    Step (C)
        a step of forming, on the conductive particles-side surface of the first connection layer, a second connection layer including a thermal- or photo-, cationic or anionic polymerizable resin layer containing an epoxy compound and a thermal- or photo-, cationic or anionic polymerization initiator or a thermal- or photo-radical polymerizable resin layer containing an acrylate compound and a thermal- or photo-radical polymerization initiator.

8. The production method according to claim 7, wherein the irradiating with UV light in the step (B) is performed from a side of the photo-radical polymerizable resin layer where the conductive particles are arranged.

9. A method of producing the anisotropic conductive film according to claim 1, comprising following steps (AA) to (DD):

Step (AA)
a step of arranging conductive particles in a single layer, on a photo-radical polymerizable resin layer containing an acrylate compound and a photo-radical polymerization initiator;

Step (BB)
a step of irradiating the photo-radical polymerizable resin layer on which the conductive particles are arranged, with UV light, to initiate photo-radical polymerization reaction, so as to form a temporal first connection layer having a surface on which the conductive particles are temporarily fixed;

Step (CC)
a step of forming, on the conductive particles-side surface of the temporal first connection layer, a second connection layer including a thermal cationic or thermal anionic polymerizable resin layer containing an epoxy compound and a thermal cationic or thermal anionic polymerization initiator, or a thermal radical polymerizable resin layer containing an acrylate compound and a thermal radical polymerization initiator; and Step (DD)
a step of irradiating the temporal first connection layer with UV light from an opposite side to the second connection layer to initiate photo-radical polymerization reaction, so as to permanently cure the temporal first connection layer to form the first connection layer.

10. The production method according to claim 9, wherein the irradiating with UV light in the step (BB) is performed from a side of the photo-radical polymerizable resin layer where the conductive particles are arranged.

11. The production method according to claim 7, comprising, after the step (C), the following step (Z)

Step (Z)
a step of forming, on an opposite surface to the conductive particles-side of the first connection layer, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator.

12. The production method according to claim 7, comprising, prior to the step (A), the following step (a)

Step (a)
a step of forming, on one surface of the photo-radical polymerizable resin layer containing the acrylate compound and the photo-radical polymerization initiator, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator, and wherein in the step (A), the conductive particles are arranged in a single layer on the other surface of the photo-radical polymerizable resin layer.

13. The production method according to claim 9, comprising, after the step (DD), the following step (Z)

Step (Z)
a step of forming, on an opposite surface to the conductive particles-side of the first connection layer, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator.

14. The production method according to claim 9, comprising, prior to the step (AA), the following step (a)

Step (a)
a step of forming, on one surface of the photo-radical polymerizable resin layer containing the acrylate compound and the photo-radical polymerization initiator, a third connection layer including a thermal- or photo-, cationic or anionic polymerizable resin layer containing an epoxy compound and a thermal- or photo-, cationic or anionic polymerization initiator, or a thermal- or photo-radical polymerizable resin layer containing an acrylate compound and a thermal- or photo-radical polymerization initiator, and wherein in the step (AA), the conductive particles are arranged in a single layer on the other surface of the photo-radical polymerizable resin layer.

15. A connection structure in which a first electronic component is connected to a second electronic component by anisotropic conductive connection using the anisotropic conductive film according to claim 1.

* * * * *